United States Patent [19]

Lohninger

[11] Patent Number: 5,761,616
[45] Date of Patent: Jun. 2, 1998

[54] FREQUENCY MIXER FOR A DOPPLER RADAR MODULE

[75] Inventor: Gerhard Lohninger, München, Germany

[73] Assignee: Siemens Aktiengesellschaft, Munich, Germany

[21] Appl. No.: 769,323

[22] Filed: Dec. 18, 1996

[30] Foreign Application Priority Data

Dec. 18, 1995 [DE] Germany .................. 195 47 289.6

[51] Int. Cl.$^6$ ...................................................... H04B 1/26
[52] U.S. Cl. .................. 455/327; 455/330; 342/104
[58] Field of Search ........................ 455/313, 318, 455/323, 327, 330, 333, 326; 342/28, 114, 5, 13, 42, 104; 327/113, 355, 356

[56] References Cited

U.S. PATENT DOCUMENTS 5,262,783  11/1993  Philpott et al. ................ 342/28
5,497,163   3/1996  Lohninger et al. ............ 455/327
5,596,325   1/1997  Maas ............................. 342/28

*Primary Examiner*—Nguyen Vo
*Attorney, Agent, or Firm*—Herbert L. Lerner; Laurence A. Greenberg

[57] ABSTRACT

A frequency mixer for a Doppler radar module with directional recognition, can be operated with a single transmitting and receiving antenna. It is thereby possible to create a Doppler radar module with low space requirements even for transmitting and receiving frequencies below 5 GHz. In the frequency mixer, a first microstrip line is coupled to a first terminal of a first diode and a second microstrip line is coupled to a first terminal of a second diode. The two microstrip lines are connected to each other through a capacitor. An antenna is coupled to the first microstrip line and an oscillator is coupled to the second microstrip line. Second terminals of each of the diodes are connected to a fixed potential in an electrically conductive manner. A phase comparator is coupled to the two microstrip lines.

8 Claims, 1 Drawing Sheet

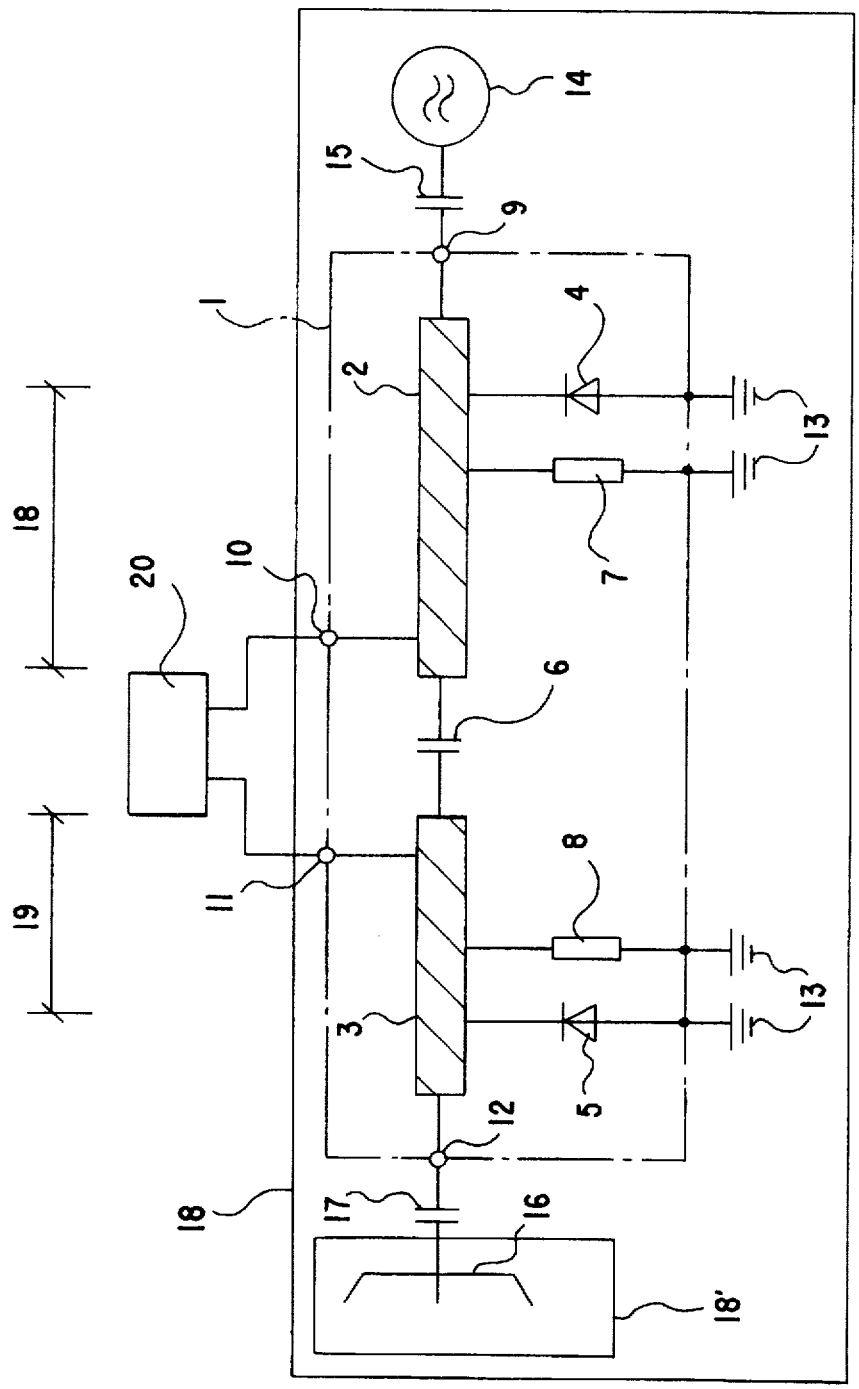

5,761,616

1

FREQUENCY MIXER FOR A DOPPLER RADAR MODULE

Background of the Invention

Field of the Invention

The invention relates to a frequency mixer for a Doppler radar module, having a first microstrip line coupled to a first terminal of a first diode and a second microstrip line coupled to a first terminal of a second diode, the two microstrip lines being coupled to each other through a capacitor, and an antenna coupled to the first microstrip line. Furthermore, a circuit configuration can be coupled to the two microstrip lines to determine a phase difference between two alternating current voltage signals.

Such a frequency mixer is disclosed, for example, in U.S. Pat. No. 5,262,783. That patent describes a movement detector having directional recognition which is constructed for an operating frequency of approximately 10 GHz and in which the frequency mixer has a first and a second diode and a first and a second microstrip line. The two microstrip lines are coupled to each other through the use of a capacitor. In addition, the first microstrip line is connected to the cathode of the first diode, the second microstrip line is connected to the anode of the second diode, and the anode of the first diode is connected to the cathode of the second diode.

A first high frequency input of such a frequency mixer is connected in a connection line between the anode of the first and the cathode of the second diode, and a second high frequency input is located on the first microstrip line.

During operation of the above-described Doppler radar module, an oscillator coupled to the first high frequency input supplies the frequency mixer with a high frequency alternating current voltage, which is simultaneously transmitted through the use of a transmitting antenna, that is also coupled to the oscillator, into the surroundings of the transmitting antenna.

A receiving antenna is coupled to the second high frequency input and that receiving antenna receives a high frequency signal which may be reflected by an object moving in the transmitting range of the Doppler radar module and feeds it to the frequency mixer. Two phase-shifted Doppler frequencies are then generated in the frequency mixer. The algebraic sign of that phase shift, which is evaluated through the use of a phase comparator that is coupled to the two microstrip lines, can be used to determine the direction of movement of the object.

Recognition of the direction leads to considerable advantages for some applications of Doppler radar movement detectors. For example, when used in automatic door openers, the period during which the door remains open can be reduced to a considerable extent.

However, a disadvantage of the above-described frequency mixer is that two antennas, that is a separate transmitting antenna and a separate receiving antenna, are required for its operation. That involves greater space requirements, in particular for transmitting and receiving frequencies below 5 GHz, since antennas for those frequencies have a very large surface area.

However, that frequency range is very important because the frequency of approximately 2.45 GHz is an authorized telecommunications operating frequency worldwide for Doppler radar modules.

Summary of the Invention

It is accordingly an object of the invention to provide a frequency mixer for a Doppler radar module, which overcomes the hereinafore-mentioned disadvantages of the heretofore-known devices of this general type and which can operate with a single antenna. Furthermore, the frequency mixer should be suitable for operation at frequencies below 5 GHz and it should be as small as possible and easy to manufacture.

With the foregoing and other objects in view there is provided, in accordance with the invention, a frequency mixer or converter assembly for a Doppler radar module, comprising first and second microstrip lines; a first diode having a first terminal connected to the first microstrip line and a second terminal electrically conductively connected to a fixed potential, a second diode having a first terminal connected to the second microstrip line and a second terminal electrically conductively connected to a fixed potential; a capacitor coupling the microstrip lines to each other; an antenna coupled to the first microstrip line; a circuit configuration to be coupled to the microstrip lines for determining a phase difference between two alternating current voltage signals; and an oscillator coupled to the second microstrip line.

In accordance with another feature of the invention, the diodes are electrically conductively connected to one and the same fixed potential.

In accordance with a further feature of the invention, the fixed potential is a ground potential.

In accordance with an added feature of the invention, there are provided resistors each connected between a respective one of the microstrip lines and the fixed potential.

In accordance with an additional feature of the invention, there is provided a single multilayer board on which the microstrip lines, the diodes, the capacitor, the antenna and the oscillator are disposed.

In accordance with yet another feature of the invention, there is provided a multilayer board having a single layer on which the microstrip lines, the diodes, the capacitor and the oscillator are disposed.

In accordance with a concomitant feature of the invention, the multilayer board has another layer on which the antenna is disposed.

Other features which are considered as characteristic for the invention are set forth in the appended claims.

Although the invention is illustrated and described herein as embodied in a frequency mixer for a Doppler radar module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The figure of the drawing is a schematic and block circuit diagram of an exemplary embodiment of the invention.

DESCRIPTION OF THE PREFERRED EMBODIMENTS

Referring now in detail to the single figure of the drawing, there is seen a circuit configuration in which components belonging to a frequency mixer are disposed within a broken line 1. Accordingly, the frequency mixer has two microstrip lines 2, 3, two diodes 4, 5, a capacitor 6, two resistors 7, 8 and four terminals 9, 10, 11, 12. The second diode 4 and the first diode 5 have first terminals in the form of cathodes which are respectively connected to the second microstrip line 2 and the first microstrip line 3. The two diodes 4, 5 have second terminals in the form of anodes connected to a fixed potential such as ground 13 and the resistors 7 and 8 are respectively connected between the microstrip line 2 and ground 13 and between the microstrip line 3 and ground 13. The two microstrip lines 2, 3 are coupled to each other through the capacitor 6, which is connected on one hand to the microstrip line 2 and on the other hand to the microstrip line 3. Moreover, the microstrip line 2 is connected to the terminals 9 and 10 and the microstrip line 3 is connected to terminals 11 and 12.

This exemplary embodiment of the frequency mixer according to the invention is fed a high frequency signal by an oscillator 14, which is coupled through a capacitor 15. This high frequency signal is transmitted through an antenna 16, which is coupled from the terminal 12, through a capacitor 17, into the surroundings of the antenna.

High frequency signals that are out-of-phase or phase-shifted relative to each other are applied to the two diodes 4 and 5. The phase shift between these two high frequency signals can be set through the capacitor 6 and line lengths 18 and 19 of the microstrip lines 2 or 3.

A high frequency signal that may be reflected by an object moving in the surroundings of the antenna 16 is received by the antenna 16 and coupled into the frequency mixer through the capacitor 17 and the terminal 12. As a result, two out-of-phase or phase-shifted Doppler signals of the same frequency are generated at the two diodes 4, 5 and the Doppler signals are evaluated by a phase comparator 20 connected to the terminals 10 and 11. The algebraic sign of the phase shift between the two Doppler frequencies indicates the direction of movement of the object.

The resistors 7 and 8 are self-biasing elements for the diodes 4 and 5 and improve the frequency mixing or conversion. The capacitors 15 and 17 are used for dc decoupling of the frequency mixer in relation to the oscillator 14 or the antenna 16 and form a low loss transition for the high frequencies.

In place of the resistors 7 and 8, a direct current voltage can be applied to the diodes 4 and 5 as well as from the outside to the diodes 4, 5, in order to apply a bias voltage. The source of the direct current voltage in this case has to be decoupled from the frequency mixer in terms of high frequency.

In the above-described frequency mixer, it is also possible to connect the anodes of the diodes 4 and 5 to any other fixed potential instead of to ground. The fixed potentials in this case do not have to be identical.

One advantage of the above-described frequency mixer lies in the fact that the Doppler signal level at the diodes 4 and 5 can be easily adjusted by adapting the capacitance of the capacitor 6 and by changing the ratio of the two line lengths 18 and 19 of the microstrip lines 2 and 3.

Another advantage is that the frequency mixer according to the invention can be easily disposed in a space-saving manner on a single layer of a multilayer board 18 of a Doppler radar module together with the oscillator 14 and the capacitors 15 and 17. The antenna 16, which is a transmitting and receiving antenna, can be disposed on a second layer 18' of the multilayer board 18 or even on a separate board.

In order to attain a low level of surface transmission of the Doppler radar module, a plurality of triplate filter structures connected to the frequency mixer can be disposed on another layer of the multilayer board or on another board. In this case, a high frequency filter structure is coupled into the connection line between the antenna 16 and the frequency mixer, and low frequency filter structures are coupled into connection lines between the microstrip lines 2 and 3 and the phase comparator 20.

I claim:

1. A frequency mixer assembly for a Doppler radar module, comprising:

a) first and second microstrip lines;

b) a first diode having a first terminal connected to said first microstrip line and a second terminal electrically conductively connected to a fixed potential, a second diode having a first terminal connected to said second microstrip line and a second terminal electrically conductively connected to a fixed potential;

c) a capacitor coupling said microstrip lines to each other;

d) an antenna coupled to said first microstrip line;

e) a circuit configuration to be coupled to said microstrip lines for determining a phase difference between two alternating current voltage signals; and f) an oscillator coupled to said second microstrip line.

2. The frequency mixer assembly according to claim 1, wherein said diodes are electrically conductively connected to one and the same fixed potential.

3. The frequency mixer assembly according to claim 1, wherein the fixed potential is a ground potential.

4. The frequency mixer assembly according to claim 1, including resistors each connected between a respective one of said microstrip lines and the fixed potential.

5. The frequency mixer assembly according to claim 1, including a single multilayer board on which said microstrip lines, said diodes, said capacitor, said antenna and said oscillator are disposed.

6. The frequency mixer assembly according to claim 1, including a multilayer board having a single layer on which said microstrip lines, said diodes, said capacitor and said oscillator are disposed.

7. The frequency mixer assembly according to claim 6, wherein said multilayer board has another layer on which said antenna is disposed.

8. A frequency mixer assembly for a Doppler radar module, comprising:

a) a frequency mixer having first and second microstrip lines, a first diode having a first terminal connected to said first microstrip line and a second terminal electrically conductively connected to a fixed potential, a second diode having a first terminal connected to said second microstrip line and a second terminal electrically conductively connected to a fixed potential, and a capacitor coupling said microstrip lines to each other;

b) an antenna coupled to said first microstrip line;

c) a circuit configuration to be coupled to said microstrip lines for determining a phase difference between two alternating current voltage signals; and d) an oscillator coupled to said second microstrip line.

* * * * *